US012622107B2

(12) United States Patent
Funakoshi et al.

(10) Patent No.: US 12,622,107 B2
(45) Date of Patent: May 5, 2026

(54) LIGHT-EMITTING ELEMENT

(71) Applicant: NICHIA CORPORATION, Anan (JP)

(72) Inventors: Ryota Funakoshi, Anan (JP);
Toshihiko Kishino, Anan (JP)

(73) Assignee: NICHIA CORPORATION, Anan (JP)

( * ) Notice: Subject to any disclaimer, the term of this
patent is extended or adjusted under 35
U.S.C. 154(b) by 356 days.

(21) Appl. No.: 18/261,439

(22) PCT Filed: Mar. 3, 2022

(86) PCT No.: PCT/JP2022/009141
§ 371 (c)(1),
(2) Date: Jul. 13, 2023

(87) PCT Pub. No.: WO2022/196374
PCT Pub. Date: Sep. 22, 2022

(65) Prior Publication Data
US 2024/0072209 A1 Feb. 29, 2024

(30) Foreign Application Priority Data
Mar. 18, 2021 (JP) ................................. 2021-045210

(51) Int. Cl.
*H10H 20/831* (2025.01)
*H10H 20/81* (2025.01)
(Continued)

(52) U.S. Cl.
CPC ...... *H10H 20/8312* (2025.01); *H10H 20/811*
(2025.01); *H10H 20/8215* (2025.01); *H10H*
*20/857* (2025.01)

(58) Field of Classification Search
CPC ............. H10H 20/8312; H10H 20/811; H10H
20/8215; H10H 20/857; H10H 20/812;
(Continued)

(56) References Cited

U.S. PATENT DOCUMENTS

| | | | |
|---|---|---|---|
| 2009/0072262 A1 | 3/2009 | Iza et al. | |
| 2010/0207100 A1* | 8/2010 | Strassburg | ........... H10H 20/825 |
| | | | 257/15 |

(Continued)

FOREIGN PATENT DOCUMENTS

| | | |
|---|---|---|
| JP | 2010-016079 A | 1/2010 |
| JP | 2010-539731 A | 12/2010 |

(Continued)

OTHER PUBLICATIONS

International Search Report with English language translation and
Written Opinion of the International Searching Authority issued in
the corresponding International Patent Application No. PCT/JP2022/
009141, dated May 10, 2022.

*Primary Examiner* — Mark W Tornow
(74) *Attorney, Agent, or Firm* — Foley & Lardner LLP

(57) ABSTRACT

A light-emitting element includes: a semiconductor stack
including: a first light-emitting unit comprising nitride semi-
conductors including a first n-side semiconductor layer, a
first p-side semiconductor layer, and a first active layer
disposed between the first n-side semiconductor layer and
the first p-side semiconductor layer, a second light-emitting
unit comprising nitride semiconductors including a second
n-side semiconductor layer, a second p-side semiconductor
layer, and a second active layer disposed between the second
n-side semiconductor layer and the second p-side semicon-
ductor layer, and a tunnel junction layer disposed between
the first p-side semiconductor layer and the second n-side
semiconductor layer; an n-side electrode electrically con-
nected to the first n-side semiconductor layer; and a p-side
electrode electrically connected to the second p-side semi-
conductor layer.

14 Claims, 3 Drawing Sheets

(51) Int. Cl.
*H10H 20/811* (2025.01)
*H10H 20/857* (2025.01)

(58) Field of Classification Search
CPC ... H10H 20/813; H10H 20/825; H10H 20/831
See application file for complete search history.

(56)                    References Cited

U.S. PATENT DOCUMENTS

| | | | |
|---|---|---|---|
| 2012/0205625 A1* | 8/2012 | Iza | H10H 20/811 |
| | | | 257/E29.091 |
| 2015/0060877 A1 | 3/2015 | Liu et al. | |
| 2017/0338373 A1 | 11/2017 | Wildeson et al. | |
| 2019/0074402 A1 | 3/2019 | Kawaguchi | |
| 2020/0335657 A1* | 10/2020 | Wildeson | H10H 20/824 |
| 2020/0350477 A1* | 11/2020 | Shim | H10H 20/8312 |

FOREIGN PATENT DOCUMENTS

| | | |
|---|---|---|
| JP | 2012-195529 A | 10/2012 |
| JP | 2017-157667 A | 9/2017 |
| JP | 2019-046971 A | 3/2019 |
| JP | 2019-517144 A | 6/2019 |

* cited by examiner

LIGHT-EMITTING ELEMENT

TECHNICAL FIELD

A certain embodiment of the present invention relates to a light-emitting element.

BACKGROUND ART

Japanese Patent Publication No. 2017-157667, for example, discloses a light-emitting element that includes a nitride semiconductor layer having a tunnel junction layer.

PRIOR ART DOCUMENTS

Patent Documents

Patent Document 1 JP 2017-157667 A

SUMMARY OF INVENTION

Technical Problem

It is desirable to reduce the forward voltage of such a light-emitting element. One object of a certain embodiment of the present invention is to provide a light-emitting element capable of reducing the forward voltage.

Solution to Problem

A light-emitting element according to one embodiment of the present invention includes: a semiconductor stack having a first light-emitting unit comprising nitride semiconductors including a first n-side semiconductor layer, a first p-side semiconductor layer, and a first active layer disposed between the first n-side semiconductor layer and the first p-side semiconductor layer, a second light-emitting unit comprising nitride semiconductors including a second n-side semiconductor layer, a second p-side semiconductor layer, and a second active layer disposed between the second n-side semiconductor layer and the second p-side semiconductor layer, and a tunnel junction layer disposed between the first p-side semiconductor layer and the second n-side semiconductor layer; an n-side electrode electrically connected to the first n-side semiconductor layer; and a p-side electrode electrically connected to the second A-side semiconductor layer, the first n-side semiconductor layer including a first stack part of a first n-type impurity concentration having a multilayer structure in which first layers and second layers having a different lattice constant from that of the first layers are alternately stacked, the second n-side semiconductor layer including a second stack part of a second n-type impurity concentration having a multilayer structure in which third layers and fourth layers having a different lattice constant from that of the third layers are alternately stacked, and the second n-type impurity concentration being higher than the first n-type impurity concentration.

Effect of the Invention

According to the light-emitting element of an embodiment of the present invention, a light-emitting element capable of reducing the forward voltage can be provided.

DETAILED DESCRIPTION

Figure 1:
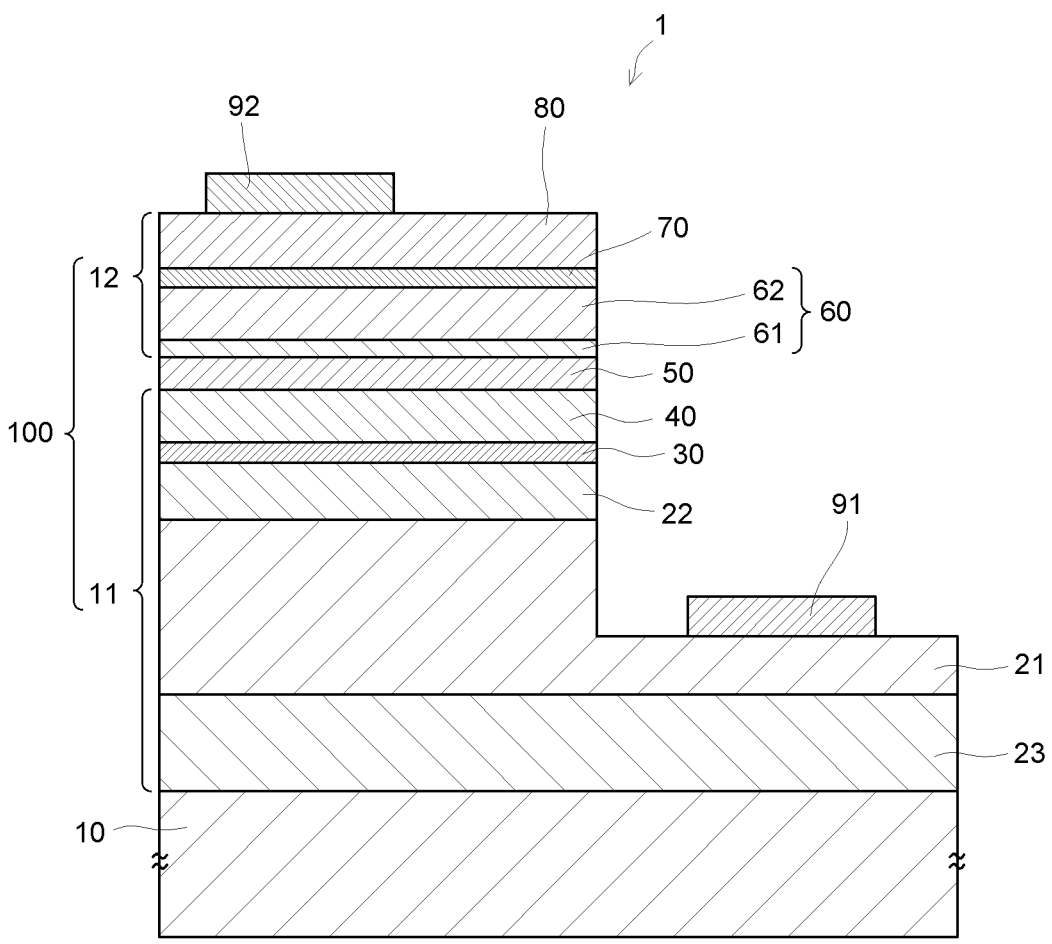
FIG. 1 is a schematic cross-sectional view of a light emitting element according to one embodiment of the present invention.

A certain embodiment of a light-emitting element according to the present invention will be explained below. The drawings referenced in the explanation below are schematic representations of the present invention. As such, the scale, spacing, and positional relationship of the members might be exaggerated or partially omitted. The scale or spacing of the members might not match between a top view and a cross-sectional view. In the explanation below, moreover, the same designations and reference numerals represent the same members or those of similar quality for which a detailed explanation might be omitted as appropriate.

FIG. 1 is a schematic cross-sectional view of a light-emitting element 1 according to one embodiment of the present invention. The light-emitting element 1 according to this embodiment has a semiconductor stack 100 which has a first light-emitting unit 11 comprising nitride semiconductors including a first n-side semiconductor layer 20, a first p-side semiconductor layer 40, and a first active layer 30 disposed between the first n-side semiconductor layer 20 and the first p-side semiconductor layer 40, a second light-emitting unit 12 located on the first light-emitting unit 11 and comprising nitride semiconductors including a second n-side semiconductor layer 60, a second p-side semiconductor layer 80, and a second active layer 70 disposed between the second p-side semiconductor layer 60 and the second n-side semiconductor layer 80, and a tunnel junction layer 50 disposed between the first p-side semiconductor layer 40 and the second n-side semiconductor layer 60. The light-emitting element 1 has an n-side electrode 91 electrically connected to the first n-side semiconductor layer 20 and a p-side electrode 92 electrically connected to the second p-side semiconductor layer 80.

The material for the substrate 10 is, for example, sapphire, silicon, SiC, GaN, or the like. A buffer layer may be disposed between the substrate 10 and the first light-emitting unit 11. For the buffer layer, for example, a layer made of AlGaN or AlN can be used.

The semiconductor stack 100 is a stack structure in which multiple nitride semiconductor layers are stacked. Nitride semiconductors can include all semiconductors obtained by varying the composition ratio x and y within their ranges in the chemical formula $In_xAl_yGa_{1-x-y}N$ ($0 \leq x \leq 1$, $0 \leq y \leq 1$, $x+y \leq 1$). In the semiconductor stack 100, a first light-emitting unit 11, a tunnel junction layer 50, and a second light-emitting unit 12 are successively stacked from the substrate 10 side.

The first light-emitting unit 11 includes a first n-side semiconductor layer 20, a first p-side semiconductor layer 40, and a first active layer 30 disposed between the first n-side semiconductor layer 20 and the first p-side semiconductor layer 40. The first light-emitting unit 11 is made of nitride semiconductors.

The first n-side semiconductor layer 20 includes an n-contact layer 21, a first stack part 22, and an underlayer 23. The first n-side semiconductor layer 20 includes one or more n-type semiconductor layers. Examples of n-type semiconductor layers include those containing an n-type impurity, such as silicon (Si), germanium (Ge), and the like. The n-type semiconductor layers are, for example, GaN, and may contain indium (In) and/or aluminum (Al). For example, the n-type impurity concentration of an n-type semiconductor layer containing Si as an n-type impurity is in a range of $1\times10^{18}/cm^3$ to $2\times10^{19}/cm^3$. The first n-side semiconductor layer 20 may include an undoped layer. An undoped layer is a layer not intentionally doped with an n-type impurity or a p-type impurity. An undoped layer may have an impurity concentration below the detectable limit in a secondary ion mass spectroscopy (SIMS) analysis or the like. In the case in which an undoped layer is adjacent to a layer that is intentionally doped with an n-type and/or p-type impurity, the undoped layer might contain the n-type and/or p-type impurity through diffusion from the adjacent layer or the like.

The n-contact layer 21 is disposed between the underlayer 23 and the first stack part 22. The n-contact layer 21 is a semiconductor layer that contains an n-type impurity. the n-type impurity concentration of the n-contact layer 21 can be in a range of $1\times10^{18}/cm^3$ to $1\times10^{19}/cm^3$. The thickness of the n-contact layer 21 can be in a range of 0.5 µm to 3 µm. The n-contact layer 21 has an upper face on which no other semiconductor layer is disposed. The n-side electrode 91 described later is disposed on the surface of the n-contact layer 21 on which no other semiconductor layer is disposed.

The first stack part 22 is disposed between the n-contact layer 21 and the first active layer 30. The first stack part 22 has a multilayer structure in which first layers and second layers having a different lattice constant from that of the first layers are alternately stacked. The first stack part 22 is a superlattice layer which includes a plurality of first layers and a plurality of second layers. The first layers and the second layers are, for example, undoped layers. The first layers are, for example, undoped GaN layers. The second layers are, for example, undoped InGaN layers. The first stack part 22 includes, for example, 15 to 25 pairs of first and second layers. The first layers can each be in a range of 0.5 nm to 3 nm in thickness. The second layers can each be 0.5 nm to 3 nm in thickness. The thickness of the first stack part 22 can be in a range of, for example, to 30 nm to 150 nm in thickness.

The first n-type impurity concentration of the first stack part 22 can be in a range of, for example, $1\times10^{17}/cm^3$ to $1\times10^{19}/cm^3$. The p-type impurity concentration of the first stack part 22 can be in a range of, for example, $1\times10^{17}/cm^3$ to $1\times10^{18}/cm^3$. The first n-type impurity concentration of the first stack part 22 refers to the highest n-type impurity concentration of all n-type impurity concentrations in the first stack part 22. The p-type impurity concentration of the first stack part 22 refers to the highest p-type impurity concentration of all p-type impurity concentrations in the first stack part 22. The n-type impurities and the p-type impurities contained in the first stack part 22 can result from either diffusion from adjacent layers or doping of the first and/or second layers with n-type or p-type impurities.

The underlayer 23 is disposed between the substrate 10 and the n-contact layer 21. The underlayer 23 is, for example, an undoped GaN layer. The thickness of the underlayer 23 can be in a range of, for example, 5 µm to 10 µm.

The first active layer 30 is disposed between the first n-side semiconductor layer 20 and the first p-side semiconductor layer 40. The first active layer 30 has, for example, a multiple quantum well structure which includes a plurality of well layers and a plurality of barrier layers. For the well layers, for example, InGaN is used. For the barrier layers, for example, GaN is used. The well layers and the barrier layers included in the first active layer 30 are, for example, undoped layers. At least some of the well layers and the barrier layers included in the first active layer 30 may contain an n-type and/or p-type impurity. The light emitted by the first active layer 30 is, for example, ultraviolet light or visible light. The first active layer 30 can emit blue light or green light, for example. The peak emission wavelength of blue light is in a range of 430 nm to 490 nm. The peak emission wavelength of green light is in a range of 500 nm to 540 nm.

The first p-side semiconductor layer 40 is disposed between the first active layer 30 and the tunnel junction layer 50. The first p-side semiconductor layer 40 includes one or more p-type semiconductor layers. Examples of p-type semiconductor layers include semiconductor layers containing a p-type impurity such as magnesium (Mg). The p-type semiconductor layers are, for example, GaN, and may contain In and/or Al. For example, the p-type impurity concentration of a p-type semiconductor layer containing Mg as a p-type impurity is in a range of $1\times10^{19}/cm^3$ to $5\times10^{20}/cm^3$. The first p-side semiconductor layer 40 may include an undoped layer. The thickness of the first p-side semiconductor layer 40 can be in a range of 30 nm to 200 nm.

The tunnel junction layer 50 is disposed between the first p-side semiconductor layer 40 and the second n-side semiconductor layer 60. The tunnel junction layer 50 contains n-type and/or p-type impurities. The tunnel junction layer 50 includes at least one of these semiconductor layers: a p-type semiconductor layer having a higher p-type impurity concentration than that of the first p-side semiconductor layer 40 and an n-type semiconductor layer having a higher n-type impurity concentration than that of the second n-side semiconductor layer 60. The tunnel junction layer 50 includes, for example, a semiconductor layer having a third n-type impurity concentration which is higher than the second n-type impurity concentration of the second n-side semiconductor layer 60. This can further narrow down the width of the depletion layer formed by the p-n junction described later. For the tunnel junction layer 50, for example, a p-type GaN layer containing Mg as a p-type impurity or an n-type GaN layer containing Si as an n-type impurity can be used. For example, the p-type impurity concentration of a p-type semiconductor layer containing Mg as a p-type impurity is in a range of $1\times10^{20}/cm^3$ to $5\times10^{21}/cm^3$. For example, the n-type impurity concentration of an n-type semiconductor layer containing Si as an n-type impurity is in a range of $2\times10^{20}/cm^3$ to $1\times10^{21}/cm^3$. Examples of nitride semiconductors constituting the tunnel junction layer 50 include GaN, InGaN, or AlGaN. The impurity concentration and the thickness of the tunnel junction layer 50 can be suitably changed. The thickness of the tunnel junction layer 50 can be in a range of, for example, 1 nm to 6 µm.

The second n-side semiconductor layer 60 includes an intermediate layer 61 and a second stack part 62. The second n-side semiconductor layer 60 includes one or more n-type semiconductor layers. Examples of n-type semiconductor layers include those that contain an n-type impurity, such as silicon (Si), germanium (Ge), or the like. The n-type semiconductor layers are, for example, GaN, and may contain indium (In) and/or aluminum (Al). For example, the n-type impurity concentration of an n-type semiconductor layer containing Si as an n-type impurity is in a range of $1 \times 10^{18}/cm^3$ to $2 \times 10^{19}/cm^3$. The second n-side semiconductor layer 60 may include an undoped layer.

The intermediate layer 61 is disposed between the tunnel junction layer 50 and the second stack part 62. The intermediate layer 61 includes an n-type semiconductor layer containing an n-type impurity. For example, the intermediate layer 61 can have a multilayer structure in which a first n-type semiconductor layer and a second n-type semiconductor layer having a lower n-type impurity concentration than that of the first n-type semiconductor layer are successively stacked from the tunnel junction layer 50 side. The n-type impurity concentration of an n-type semiconductor layer included in the intermediate layer 61 can be set lower than that of an n-type semiconductor layer included in the tunnel junction layer 50. Providing an intermediate layer 61 can improve the surface condition of the semiconductor layer on which a second stack part 62 is grown as compared to the surface condition of the tunnel junction layer 50, thereby improving the crystallinity of the second stack part 62. The thickness of the intermediate layer 61 can be in a range of, for example, 100 nm to 200 nm. In the case in which the intermediate layer 61 is a multilayer structure, for example, the first n-type semiconductor layer can be 15 nm to 60 nm in thickness and the second n-type semiconductor layer can be in a range of 40 nm to 180 nm in thickness.

The second stack part 62 is disposed between the intermediate layer 61 and the second active layer 70. The second stack part 62 has a multilayer structure in which third layers and fourth layers having a different lattice constant from that of the third layers are alternately stacked. The second stack part 62 is a superlattice layer which includes a plurality of third layers and a plurality of fourth layers. The third layers and the fourth layers are, for example, layers doped with an n-type impurity. The third layers are, for example, n-type GaN layers containing an n-type impurity. The fourth layers are, for example, n-type InGaN layers containing an n-type impurity. The second stack part 62 includes, for example, 15 to 25 pairs of third and fourth layers. The n-type impurity has only to be contained in either the third or fourth layers. For example, the third layers can be n-type impurity doped layers, and the fourth layers undoped layers.

The thickness of the second stack part 62 can be set less than the thickness of the first stack part 22. This can reduce the spreading of V-pits formed in the upper face of the second stack part 62 as compared to the first stack part 22, thereby improving the crystallinity of the second active layer 70 which will be formed on the second stack part 62. The thickness of each third layer can be set to 0.5 nm to 3 nm. The thickness of each fourth layer can be set to 0.5 nm to 3 nm. The thickness of the second stack part 62 can be in a range of, for example, 30 nm to 150 nm. In the case of setting the thickness of the second stack part 62 to be less than that of the first stack part 22, for example, the thicknesses of the first stack part 22 and the second stack part 62 can be in a range of 50 nm to 70 nm and 30 nm to 50 nm, respectively.

The second stack part 62 includes a semiconductor layer doped with an n-type impurity. The second n-type impurity concentration of the second stack part 62 is higher than the first n-type impurity concentration of the first stack part 22. This can reduce the diffusion of the p-type impurities from the first p-side semiconductor layer 40 and the tunnel junction layer 50 into the semiconductor layers which will be formed on the second stack part 62. For example, allowing the second n-side semiconductor layer 60 to contain a p-type impurity might promote the conversion of the layer into a p-type layer. According to this embodiment, such a p-type conversion attributed to p-type impurity diffusion can be reduced to supply carriers to the tunnel junction layer 50 efficiently. This can reduce the forward voltage Vf. The second n-type impurity concentration of the second stack part 62 is preferably in a range of, for example, $3 \times 10^{17}/cm^3$ to $1 \times 10^{20}/cm^3$, more preferably $1 \times 10^{18}/cm^3$ to $1 \times 10^{20}/cm^3$. The p-type impurity concentration of the second stack part 62 is higher than the p-type impurity concentration of the first stack part 22. The p-type impurity concentration of the second stack part 62 can be in a range of, for example, $3 \times 10^{17}/cm^3$ to $5 \times 10^{18}/cm^3$. The second n-type impurity concentration of the second stack part 62 refers to the highest n-type impurity concentration of all n-type impurity concentrations in the second stack part 62. The p-type impurity concentration of the second stack part 62 refers to the highest p-type impurity concentration of all p-type impurity concentrations in the second stack part 62.

The second n-type impurity concentration of the second stack part 62 is higher than the p-type impurity concentration of the second stack part 62. This can deter the p-type conversion in the second stack part 62. For example, even if the p-type impurity concentration of the second stack part 62 is higher than the p-type impurity concentration of the first stack part 22, the p-type conversion in the second stack part 62 can be reduced.

The second active layer 70 is disposed between the second stack part 62 and the second p-side semiconductor layer 80. The second active layer 70 has, for example, a multiple quantum well structure which includes a plurality of well layers and a plurality of barrier layers. For the well layers, for example, InGaN is used. For the barrier layers, for example, GaN is used. The well layers and the barrier layers included in the second active layer 70 are, for example, undoped layers. At least some of the well layers and the barrier layers in the second active layer 70 may contain an n-type and/or p-type impurity.

The light emitted by the second active layer 70 is, for example, ultraviolet light or visible light. The light emitted by the first active layer 30 and the second active layer 70 may be blue light, for example. The peak emission wavelength of the light from the first active layer 30 may be different from the peak emission wavelength of the light from the second active layer 70. For example, the light from the first active layer 30 can be blue light, and the light from the second active layer 70 green light.

The second p-side semiconductor layer 80 is disposed on the second active layer 70. The second p-side semiconductor layer 80 includes one or more p-type semiconductor layers. Examples of p-type semiconductor layers include those containing a p-type impurity such as magnesium (Mg). The p-type semiconductor layers are, for example, GaN, and may contain In and/or Al. For example, the p-type impurity concentration of a p-type semiconductor layer containing Mg as a p-type impurity is in a range of $1 \times 10^{19}/cm^3$ to $5 \times 10^{20}/cm^3$. The second A-side semiconductor layer 80 may include an undoped layer. The thickness of the second p-side semiconductor layer 80 can be in a range of 30 nm to 200 nm.

An n-side electrode 91 is disposed on the first n-side semiconductor layer 20 to be electrically connected to the first n-side semiconductor layer. The n-side electrode 91 is disposed on the upper face of the n-contact layer 21. A p-side electrode 92 is disposed on the second p-side semiconductor layer 80 to be electrically connected to the second p-side semiconductor layer 80.

A forward voltage is applied across the n-side electrode 91 and the p-side electrode 92. At this time, the forward voltage is applied across the second p-side semiconductor layer 80 and the n-contact layer 21, supplying holes and electrons to the first active layer 30 and the second active layer 70 to allow the first active layer 30 and the second active layer 70 to emit light.

When a positive potential is applied to the p-side electrode 92 and a lower potential than that is applied to the n-side electrode 91, a reverse voltage would apply across the second n-side semiconductor layer 60 and the first p-side semiconductor layer 40. As such, the tunneling effect of the tunnel junction layer 50 is utilized to allow current to flow across the second n-side semiconductor layer 60 and the first p-side semiconductor layer 40. In other words, current can flow as the electrons from the valence band of the first p-side semiconductor layer 40 tunnel into the conduction band of the second n-side semiconductor layer 60.

In order to achieve such a tunneling effect, the tunnel junction layer 50 is formed with at least one of the semiconductor layers: a p-type semiconductor layer having a higher p-type impurity concentration than that of the first p-side semiconductor layer 40 and an n-type semiconductor layer having a higher n-type impurity concentration than that of the second n-side semiconductor layer 60. A p-n junction is formed with such a tunnel junction layer 50. For example, a p-n junction is formed with the first p-side semiconductor layer 40 and the tunnel junction layer 50 employing an n-type semiconductor layer doped with a high concentration of an n-type impurity. As another example, a p-n junction is formed with the tunnel junction layer 50 employing a p-type semiconductor layer doped with a high concentration of a p-type impurity and the second n-side semiconductor layer 60. As another example, a p-n junction is formed by constructing the tunnel junction layer 50 as a stack structure that includes an n-type semiconductor layer doped with a high concentration of an n-type impurity and a p-type semiconductor layer doped with a high concentration of a p-type impurity. The higher the concentration of each of the conductivity type impurities contained in the first p-side semiconductor layer 40, the tunnel junction layer 50, and the second n-side semiconductor layer 60, the narrower the width of the depletion layer formed by the p-n junction described above can result. The narrower the width of the depletion layer, the easier it is for the electrons present in the valence band of the first p-side semiconductor layer 40 to tunnel through the depletion layer into the conduction band of the second n-side semiconductor layer 60 when a voltage is applied.

As described above, according to the light-emitting element of this embodiment, the diffusion of p-type impurities into the second stack part 62 and the semiconductor layers formed on the second stack part 62 can be reduced to thereby reduce the forward voltage Vf. Furthermore, stacking the second active layer 70 on the first active layer 30 can increase the per unit area output as compared to a light-emitting element having a single active layer.

Next, an example of a method of manufacturing a light-emitting element 1 according to this embodiment will be explained.

Figure 2:
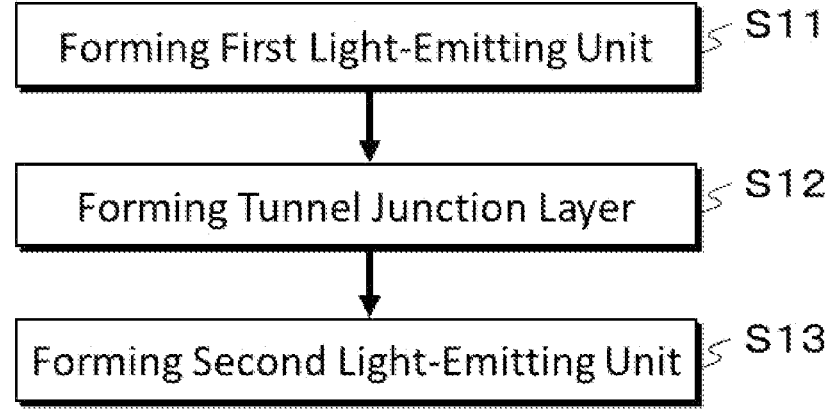
FIG. 2 is a flowchart of a method of manufacturing a light emitting element according to one embodiment of the present invention.
Figure 3A:
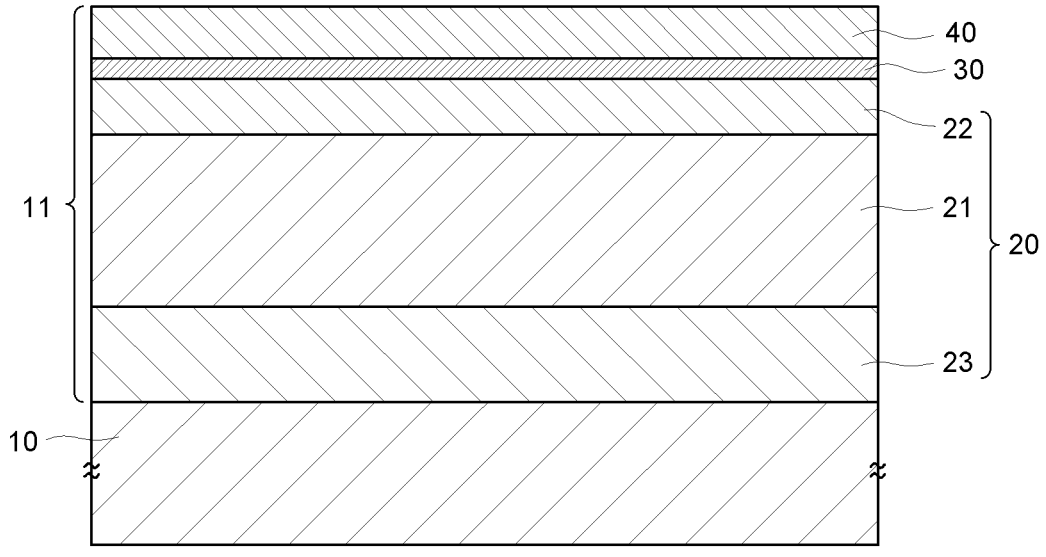
FIG. 3A is a schematic diagram showing a method of manufacturing a light emitting element according to one embodiment of the present invention.
Figure 3B:
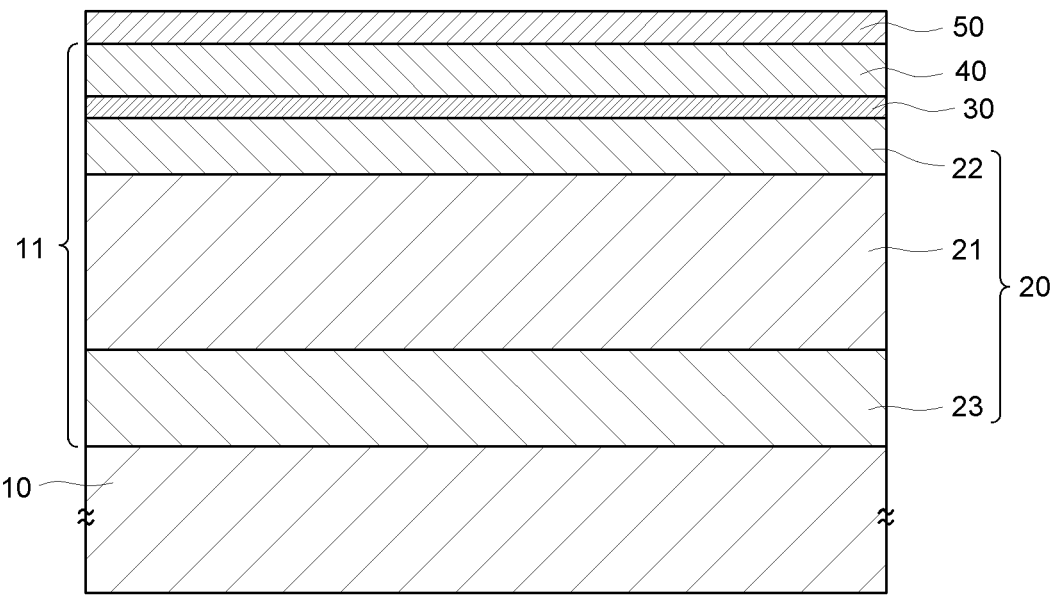
FIG. 3B is a schematic diagram showing the method of manufacturing a light emitting element according to the embodiment of the present invention.
Figure 3C:
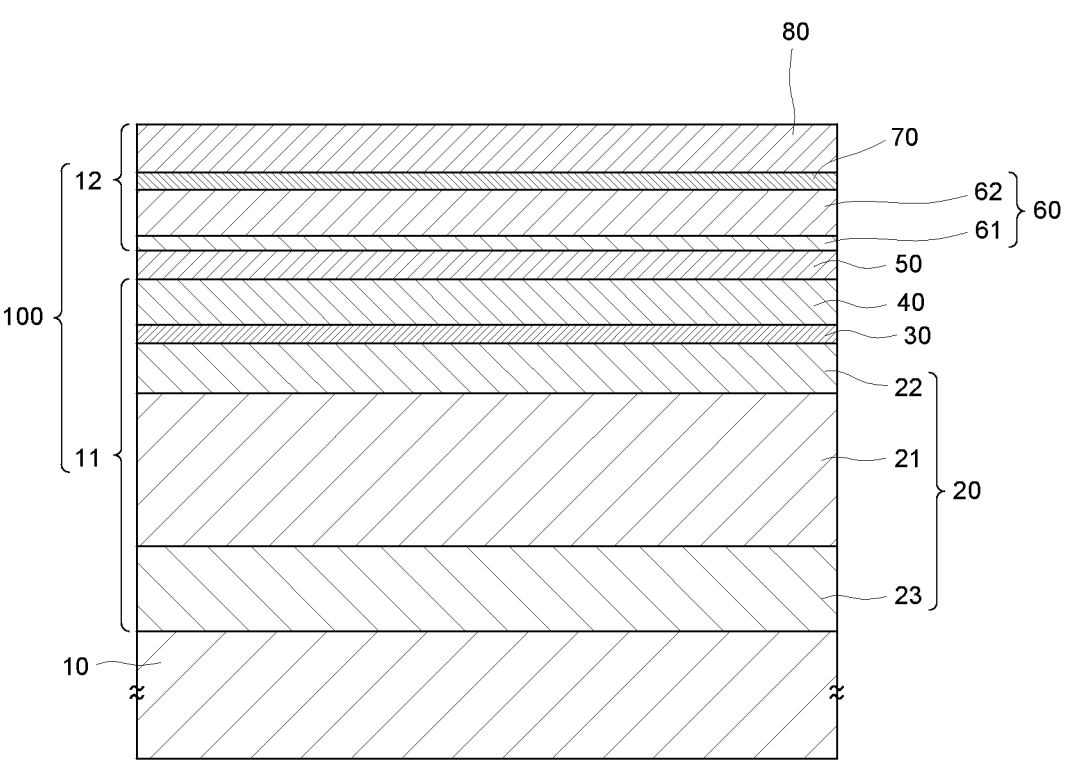
FIG. 3C is a schematic diagram showing the method of manufacturing a light emitting element according to the embodiment of the present invention.

FIG. 2 is a flowchart of a method of manufacturing a light-emitting element of this embodiment. As shown in FIG. 2, the method of manufacturing a light-emitting element of this embodiment includes a first light-emitting unit forming step S11, a tunnel junction layer forming step S12, and a second light-emitting unit forming step S13. FIG. 3A to FIG. 3C are schematic cross-sectional views of the method of manufacturing a light-emitting element of this embodiment.

Each nitride semiconductor layer included in a semiconductor stack 100 is formed by MOCVD (metal organic chemical vapor deposition) in a pressure and temperature adjustable chamber. Each nitride semiconductor layer is epitaxially grown on a substrate 10, for example. Each nitride semiconductor layer can be formed by introducing a carrier gas and a source gas into the chamber. For the carrier gas, hydrogen ($H_2$) or nitrogen ($N_2$) gas can be used. Ammonia ($NH_3$) gas can be used as a nitrogen source. Trimethylgallium (TMG) or triethylgallium (TEG) gas can be used as a Ga source gas. Trimethylindium (TMI) gas can be used as an In source gas. Trimethylaluminum (TMA) gas can be used as an Al source gas. Monosilane ($SiH_4$) gas can be used as a Si source gas. Bis(cyclopentadienyl)magnesium ($Cp_2Mg$) gas can be used as a Mg source gas.

First, the first light-emitting unit forming step S11 is conducted. The first light-emitting unit forming step S11 includes forming a first n-side semiconductor layer 20 on a substrate 10, forming a first active layer 30 on the first n-side semiconductor layer 20, and forming a first p-side semiconductor layer 40 on the first active layer 30. In the step of forming a first n-side semiconductor layer 20, an underlayer 23, an n-contact layer 21, and a first stack part 22 are formed in that order on a substrate 10. As shown in FIG. 3A, a first light-emitting unit 11 which includes a first n-side semiconductor layer 20, a first active layer 30, and a first p-side semiconductor layer 40 is formed on the substrate 10 by the first light-emitting unit forming step S11. A buffer layer may be formed on the surface of the substrate 10 before forming an underlayer 23 on the substrate 10. For the buffer layer, for example, GaN or AlGaN can be used.

The first stack part 22 is formed, for example, by alternately conducting a first layer forming step and a second layer forming step. In the first layer forming step, for example, a first layer made of an undoped GaN layer is formed by introducing a carrier gas and a source gas that contains a Ga source and an N source into the chamber. In the second layer forming step, for example, a second layer made of an undoped InGaN layer is formed by introducing a carrier gas and a source gas that contains a Ga source, an N source, and an In source into the chamber. In the first n-side semiconductor layer 20 forming step, the layers are formed such that the first n-type impurity concentration of the first stack part 22 will fall within a range of $1 \times 10^{17}/cm^3$ to $1 \times 10^{19}/cm^3$, for example.

Next, the tunnel junction forming step S12 is conducted. In the tunnel junction layer forming step S12, as shown in FIG. 3B, a tunnel junction layer 50 is formed on the first light-emitting unit 11. In the tunnel junction layer forming step S12, for example, a tunnel junction layer 50 made of a GaN layer having a third n-type impurity concentration is formed by introducing into the chamber a carrier gas and a source gas that contains a Ga source, an N source, and an Si source. For example, the tunnel junction layer 50 is formed by adjusting the flow rate of the Si source gas contained in the source gas such that the third n-type impurity concentration is in a range of $2 \times 10^{20}/cm^3$ to $1 \times 10^{21}/cm^3$. In forming the tunnel junction layer 50, the Si source gas flow rate is set higher than the Si source gas flow rates used in the third layer forming step and the fourth layer forming step described later.

Next, the second light-emitting unit forming step S13 is conducted. In the second light-emitting unit forming step S13, as shown in FIG. 3C, a second light-emitting unit 12 is formed on the tunnel junction layer 50. The second light-emitting unit forming step S13 includes forming a second n-side semiconductor layer 60 on the tunnel junction layer 50, forming a second active layer 70 on the second n-side semiconductor layer 60, and forming a second p-side semiconductor layer 80 on the second active layer 70. In the step of forming a second n-side semiconductor layer 60, an intermediate layer 61 and a second stack part 62 are formed in that order on the tunnel junction layer 50. The intermediate layer 61 is formed, for example, in contact with the tunnel junction layer 50.

The second stack part 62 is formed, for example, by alternately conducting a step of forming a third layer and a step of forming a fourth layer. In forming a third layer, for example, a third layer made of a GaN layer doped with an n-type impurity is formed by introducing into the chamber a carrier gas and a source gas that contains a Ga source, an N source, and an Si source. In forming a fourth layer, for example, a fourth layer made of InGaN doped with an n-type impurity is formed by introducing into the chamber a carrier gas and a source gas which contains a Ga source, an N source, an In source, and a Si source. In the steps of forming third layers and fourth layers, the flow rates of the Si source gas contained in the source gases are adjusted to form the second stack part 62 such that the second n-type impurity concentration in the second stack part 62 is higher than the first n-type impurity concentration in the first stack part 22. The second stack part 62 is formed such that the second n-type impurity concentration is in a range of, for example, $3\times10^{17}/cm^3$ to $1\times10^{20}/cm^3$.

Next, a portion of the semiconductor stack 100 is removed to expose a portion of the n-contact layer 21. Then as shown in FIG. 1, an n-side electrode 91 is formed on the n-contact layer 21, and a p-side electrode 92 is formed on the second p-side semiconductor layer 80. The n-side electrode 91 and the p-side electrode 92 can be formed, for example, by sputtering or vapor deposition. By following these steps described above, the light-emitting element 1 shown in FIG. 1 can be obtained.

Light-emitting elements in the Example and the Comparative Example described below were produced, and their forward voltages Vf and the outputs Po were evaluated.

EXAMPLE

As the substrate 10, a sapphire substrate was used. On the sapphire substrate, a buffer layer 11 made of undoped AlGaN was formed. An underlayer 23 made of undoped GaN of about 7 in thickness was formed on the buffer layer. An n-contact layer 21 doped with Si was formed on the underlayer 23 to a thickness of about 1.8 μm. The n-type impurity concentration of the n-contact layer 21 was about $1\times10^{19}/cm^3$. On the n-contact layer 21, a first stack part 22 in which first layers made of undoped GaN and second layers made of undoped InGaN were alternately stacked was formed. The thickness of each first layer was about 2 nm, and the thickness of each second layer was about 1 nm. The first stack part 22 had 20 pairs of first and second 1 layers. The n-type impurity concentration in the first stack part 22 was about $3\times10^{17}/cm^3$. On the first stack part 22, undoped InGaN layers and undoped GaN layers were alternately formed as a first active layer 30; seven pairs of undoped InGaN and undoped GaN layers were formed. On the first active layer 30, an Mg doped AlGaN layer, an undoped GaN layer, and an Mg doped GaN layer were successively formed as a first p-side semiconductor layer 40. The p-type impurity concentration of the Mg doped GaN layer in the first p-side semiconductor layer 40 was about $3\times10^{20}/cm^3$.

On the first p-side semiconductor 40, a Si doped GaN layer was formed as a tunnel junction layer 50. The n-type impurity concentration of the tunnel junction layer 50 was about $8\times10^{20}/cm^3$.
The thickness of the tunnel junction layer 50 was about 2 nm.

On the tunnel junction layer 50, a Si doped GaN layer was formed as an intermediate layer 61. The n-type impurity concentration of the intermediate layer 61 was about $8\times10^{20}/cm^3$. The thickness of the intermediate layer 61 was about 145 nm. On the intermediate layer 61, a second stack part 62 was formed by alternately stacking third layers made of Si doped GaN and fourth layers made of Si doped InGaN. The thickness of each third layer was about 2 nm, and the thickness of each fourth layer was about 1 nm. The second stack part 62 included 20 pairs of third and fourth layers. The n-type impurity concentration in the second stack part 62 was about $2\times10^{19}/cm^3$. On the second stack part 62, undoped InGaN layers and undoped GaN layers were alternately stacked as a second active layer 70; seven pairs of undoped InGaN and undoped GaN layers were formed. On the second active layer 70, an Mg doped AlGaN layer, an undoped GaN layer, and an Mg doped GaN layer were successively formed as a second p-side semiconductor layer 80. The p-type impurity concentration of the Mg doped GaN layer in the second p-side semiconductor layer 80 was about $3\times10^{20}/cm^3$.

A light-emitting element having such a semiconductor stack 100 was produced as the Example.

Comparative Example

A light-emitting element in the Comparative Example had the same structure as the light-emitting element in the Example except for the second stack part 62 which had a different structure. Specifically, the second stack part 62 had a structure in which 20 pairs of undoped InGaN layers as the third layers and undoped GaN layers as the fourth layers were stacked. In other words, the third and fourth layers of the second stack part 62 in the light-emitting element in the Comparative Example were not doped with any n-type impurity.

The forward voltage Vf of the light-emitting element in the Example was lower than that of the light-emitting element in the Comparative Example by 0.13 V. The output Po of the light-emitting element in the Example was about the same as that of the light-emitting element in the Comparative Example. The forward voltage Vf values were those obtained when a 500 mA current was allowed to flow through the light-emitting elements. The evaluation results confirm that the light-emitting element in the Example can reduce the forward voltage Vf while maintaining the output Po as compared to the light-emitting element in the Comparative Example.

In the foregoing, certain embodiments of the present invention have been explained with reference to specific examples. The present invention, however, is not limited to these specific examples. All forms implementable by a person skilled in the art by suitably making design changes based on any of the embodiments of the present invention described above also fall within the scope of the present invention so long as they encompass the subject matter of the present invention. Furthermore, various modifications and alterations within the spirit of the present invention that could have been made by a person skilled in the art also fall within the scope of the present invention.

REFERENCE NUMERALS

1 Light-emitting element
10 Substrate
11 First light-emitting unit
12 Second light-emitting unit
20 First n-side semiconductor layer
21 N-contact layer
22 First stack part
23 Underlayer
30 First active layer
40 First p-side semiconductor layer
50 Tunnel junction layer
60 Second n-side semiconductor layer
61 Intermediate layer
62 Second stack part
70 Second active layer
80 Second p-side semiconductor layer
91 N-side electrode
92 P-side electrode
100 Semiconductor stack

The invention claimed is:

1. A light-emitting element comprising:
a semiconductor stack comprising:
    a first light-emitting unit comprising nitride semiconductors including a first n-side semiconductor layer, a first p-side semiconductor layer, and a first active layer disposed between the first n-side semiconductor layer and the first p-side semiconductor layer,
    a second light-emitting unit comprising nitride semiconductors including a second n-side semiconductor layer, a second p-side semiconductor layer, and a second active layer disposed between the second n-side semiconductor layer and the second p-side semiconductor layer, and
    a tunnel junction layer disposed between the first p-side semiconductor layer and the second n-side semiconductor layer;
an n-side electrode electrically connected to the first n-side semiconductor layer; and
a p-side electrode electrically connected to the second p-side semiconductor layer; wherein:
the first n-side semiconductor layer comprises a first stack part of a first n-type impurity concentration having a multilayer structure in which first layers and second layers having a different lattice constant from that of the first layers are alternately stacked;
the second n-side semiconductor layer comprises a second stack part of a second n-type impurity concentration having a multilayer structure in which third layers and fourth layers having a different lattice constant from that of the third layers are alternately stacked;

the second n-type impurity concentration is higher than the first n-type impurity concentration; and
a thickness of the second stack part is less than a thickness of the first stack part.

2. The light-emitting element according to claim 1 wherein the first layers and the second layers are undoped layers.

3. The light-emitting element according to claim 1 wherein the third layers and the fourth layers are doped with an n-type impurity.

4. The light-emitting element according to claim 1 wherein the tunnel junction layer comprises a semiconductor layer of a third n-type impurity concentration which is higher than the second n-type impurity concentration.

5. The light-emitting element according to claim 1 wherein the second n-type impurity concentration is higher than the p-type impurity concentration of the second stack part.

6. The light-emitting element according to claim 1 wherein the p-type impurity concentration of the second stack part is higher than the p-type impurity concentration of the first stack part.

7. The light-emitting element according to claim 1, wherein:
a thickness of the first stack part is in a range of 30 nm to 150 nm; and
a thickness of the second stack part is in a range of 30 nm to 150 nm.

8. The light-emitting element according to claim 1, wherein:
a thickness of the first stack part is in a range of 50 nm to 70 nm; and
a thickness of the second stack part is in a range of 30 nm to 50 nm.

9. The light-emitting element according to claim 4, further comprising:
an intermediate layer disposed between the tunnel junction layer and the second stack part; wherein:
an n-type impurity concentration of the intermediate layer is lower than the third n-type impurity concentration.

10. The light-emitting element according to claim 9, wherein a thickness of the intermediate layer is in a range of 100 nm to 200 nm.

11. The light-emitting element according to claim 1 wherein the first n-type impurity concentration is in a range of $1\times10^{17}/cm^3$ to $1\times10^{19}/cm^3$.

12. The light-emitting element according to claim 10 wherein the first n-type impurity concentration is in a range of $1\times10^{17}/cm^3$ to $1\times10^{19}/cm^3$.

13. The light-emitting element according to claim 11 wherein the second n-type impurity concentration is in a range of $3\times10^{17}/cm^3$ to $1\times10^{20}/cm^3$.

14. The light-emitting element according to claim 12 wherein the second n-type impurity concentration is in a range of $3\times10^{17}/cm^3$ to $1\times10^{20}/cm^3$.

* * * * *